United States Patent
Chesnutt et al.

(10) Patent No.: US 9,048,784 B2
(45) Date of Patent: Jun. 2, 2015

(54) METHOD FOR DATA COMMUNICATION VIA A VOICE CHANNEL OF A WIRELESS COMMUNICATION NETWORK USING CONTINUOUS SIGNAL MODULATION

(75) Inventors: Elizabeth Chesnutt, Troy, MI (US); Jijun Yin, Los Angeles, CA (US); Sethu Madhavan, Canton, MI (US); Iqbal Surti, Troy, MI (US)

(73) Assignee: General Motors LLC, Detroit, MI (US)

( * ) Notice: Subject to any disclaimer, the term of this patent is extended or adjusted under 35 U.S.C. 154(b) by 2243 days.

(21) Appl. No.: 11/696,168

(22) Filed: Apr. 3, 2007

(65) Prior Publication Data

US 2008/0247484 A1    Oct. 9, 2008

(51) Int. Cl.
    *H04L 27/06*      (2006.01)
    *H03C 5/00*      (2006.01)

(52) U.S. Cl.
    CPC ........................................ *H03C 5/00* (2013.01)

(58) Field of Classification Search
    CPC ..................................................... H04L 27/06
    USPC .................................. 375/316, 340, 341, 347
    See application file for complete search history.

(56) References Cited

U.S. PATENT DOCUMENTS

| | | | |
|---|---|---|---|
| 3,731,201 A | | 5/1973 | Frisbie |
| 3,832,637 A | * | 8/1974 | Alexander et al. ............ 375/223 |
| 4,499,339 A | | 2/1985 | Richard |
| 4,577,333 A | * | 3/1986 | Lewis et al. .................... 375/272 |
| 4,675,614 A | | 6/1987 | Gehrke |
| 4,928,107 A | | 5/1990 | Kuroda et al. |
| 5,043,736 A | | 8/1991 | Darnell et al. |
| 5,223,844 A | | 6/1993 | Mansell et al. |
| 5,235,633 A | | 8/1993 | Dennison et al. |
| 5,365,450 A | | 11/1994 | Schuchman et al. |
| 5,388,147 A | | 2/1995 | Grimes |
| 5,422,816 A | | 6/1995 | Sprague et al. |
| 5,539,810 A | | 7/1996 | Kennedy, III et al. |
| 5,555,286 A | | 9/1996 | Tendler |
| 5,657,350 A | * | 8/1997 | Hofmann ...................... 375/241 |

(Continued)

FOREIGN PATENT DOCUMENTS

| | | |
|---|---|---|
| EP | 0545783 | 6/1993 |
| GB | 2365297 | 2/2002 |

(Continued)

OTHER PUBLICATIONS

Merriam Webster's online definition of "full". http://www.merriam-webster.com/dictionary/full, 2012.*

(Continued)

*Primary Examiner* — Kevin M Burd
(74) *Attorney, Agent, or Firm* — Anthony Luke Simon; Reising Ethington P.C.

(57) ABSTRACT

A system and method for data communication over a cellular communications network that allows the transmission of digital data over a voice channel using a vocoder that monitors parameters of a Levinson Durbin recursion and then uses full rate CELP if the monitored prediction error falls to below a predetermined threshold within a pre-selected number of iterations of the recursion. The system and method encode digital data to be transmitted using a continuous signal modulation technique at a selected bit rate and one or more frequencies that are selected such that the resulting modulated carrier signal is processed by the vocoder using full rate CELP as a result of the monitored prediction error.

23 Claims, 4 Drawing Sheets

(56) References Cited

U.S. PATENT DOCUMENTS

| | | | |
|---|---|---|---|
| 5,712,899 A | 1/1998 | Pace, II | |
| 5,754,554 A | 5/1998 | Nakahara | |
| 5,786,789 A | 7/1998 | Janky | |
| 5,812,087 A | 9/1998 | Krasner | |
| 5,946,304 A | 8/1999 | Chapman | |
| 5,978,756 A | 11/1999 | Walker | |
| 5,999,125 A | 12/1999 | Kurby | |
| 6,011,806 A | 1/2000 | Herring | |
| 6,049,303 A | 4/2000 | Biacs et al. | |
| 6,070,089 A | 5/2000 | Brophy et al. | |
| 6,091,969 A | 7/2000 | Brophy et al. | |
| 6,108,317 A | 8/2000 | Jones et al. | |
| 6,140,956 A | 10/2000 | Hillman | |
| 6,144,336 A | 11/2000 | Preston et al. | |
| 6,175,801 B1 | 1/2001 | Millington | |
| 6,226,529 B1 | 5/2001 | Bruno et al. | |
| 6,236,652 B1 | 5/2001 | Preston et al. | |
| 6,345,251 B1 | 2/2002 | Jansson et al. | |
| 6,363,339 B1 | 3/2002 | Rabipour et al. | |
| 6,366,772 B1 | 4/2002 | Arnson | |
| 6,493,338 B1 | 12/2002 | Preston et al. | |
| 6,611,804 B1 | 8/2003 | Dorbecker et al. | |
| 6,614,349 B1 | 9/2003 | Proctor et al. | |
| 6,681,121 B1 | 1/2004 | Preston et al. | |
| 6,690,681 B1 | 2/2004 | Preston et al. | |
| 6,748,026 B1 | 6/2004 | Murakami et al. | |
| 6,771,629 B1 | 8/2004 | Preston et al. | |
| 6,813,497 B2 * | 11/2004 | Hutcheson et al. | 455/453 |
| 6,920,129 B2 | 7/2005 | Preston et al. | |
| 6,940,967 B2 * | 9/2005 | Makinen et al. | 379/387.01 |
| 7,151,768 B2 | 12/2006 | Preston et al. | |
| 7,164,662 B2 | 1/2007 | Preston et al. | |
| 7,173,995 B2 | 2/2007 | Karlquist | |
| 7,206,305 B2 | 4/2007 | Preston et al. | |
| 7,239,859 B2 | 7/2007 | Madhavan et al. | |
| 2002/0001317 A1 | 1/2002 | Herring | |
| 2002/0097701 A1 | 7/2002 | Lupien et al. | |
| 2002/0111172 A1 | 8/2002 | DeWolf et al. | |
| 2002/0175855 A1 | 11/2002 | Richton et al. | |
| 2002/0177450 A1 | 11/2002 | Vayanos | |
| 2003/0069694 A1 | 4/2003 | Fuchs | |
| 2003/0142646 A1 | 7/2003 | Paneth et al. | |
| 2003/0144836 A1 | 7/2003 | Kurtz | |
| 2003/0219068 A1 | 11/2003 | Smith | |
| 2003/0225574 A1 | 12/2003 | Matsuura et al. | |
| 2004/0008618 A1 | 1/2004 | Shirakata et al. | |
| 2004/0198378 A1 | 10/2004 | Hay | |
| 2004/0214599 A1 | 10/2004 | Ogino | |
| 2004/0220803 A1 | 11/2004 | Chiu et al. | |
| 2005/0013283 A1 | 1/2005 | Yoon et al. | |
| 2005/0021332 A1 | 1/2005 | Ryu et al. | |
| 2005/0113061 A1 | 5/2005 | Madhavan et al. | |
| 2005/0125152 A1 | 6/2005 | Fuchs et al. | |
| 2005/0143916 A1 | 6/2005 | Kim et al. | |
| 2005/0175113 A1 | 8/2005 | Okuyama | |
| 2005/0182530 A1 | 8/2005 | Murphy | |
| 2006/0224317 A1 | 10/2006 | Sarkar | |
| 2006/0239363 A1 | 10/2006 | Blakeney et al. | |
| 2006/0262875 A1 | 11/2006 | Madhavan | |
| 2006/0280159 A1 | 12/2006 | Bi et al. | |
| 2007/0092024 A1 | 4/2007 | Madhavan et al. | |
| 2007/0109185 A1 | 5/2007 | Kracke et al. | |
| 2007/0129077 A1 | 6/2007 | Iguchi et al. | |
| 2007/0135134 A1 | 6/2007 | Patrick | |
| 2007/0190950 A1 | 8/2007 | Madhavan et al. | |
| 2007/0244695 A1 | 10/2007 | Manjunath et al. | |
| 2007/0258398 A1 | 11/2007 | Chesnutt et al. | |
| 2008/0255828 A1 | 10/2008 | Chesnutt et al. | |
| 2008/0273644 A1 | 11/2008 | Chesnutt et al. | |

FOREIGN PATENT DOCUMENTS

| | | |
|---|---|---|
| WO | WO8912835 | 12/1989 |
| WO | WO2005/109923 | 11/2005 |

OTHER PUBLICATIONS

Letter of May 15, 2007, from Marc E. Hankin to Anthony Simon (1 page).

Letter of Jun. 25, 2007 from Micah D. Stolowitz to James D. Stevens (2 pages).

Letter of Jun. 20, 2007 from Vernon W. Francissen to Anthony L. Simon (2 pages).

Lin; D., et al. "Data Compression of Voiceband Modem Signals," 40th IEEE Vehicular Technology Conference, May 6-9, 1990, pp. 323-325, Orlando, Florida.

Mueller; Joseph A. "A DSP Implemented Dual 9600/7200 bps TCM Modem for Mobile Communications Over FM Voice Radios," Aug. 20, 1997, IEEE, pp. 758-761.

Speech Coding with Linear Predictive Coding (LPC); www.dspexperts.com/dsp; retrieved Aug. 14, 2005; author unknown; 15 pages.

Phase-Shift Keying; retrieved from Wikipedia at www.wikipedia.org; dated May 5, 2006; 13 pages.

3GPP2 C.S0014-A Version 1.0, Enhanced Variable Rate Codec, Speech Service Option 3 for Wideband Spread Spectrum Digital Systems, 3ggp2.org, Apr. 2004, 144 pages.

3GPP2 C.S0014-B Version 1.0, Enhanced Variable Rate Codec, Speech Service 3 Option 3 and 68 for Wideband Spread Spectrum 4 Digital Systems, 3gpp2.org, May 2006, 282 pages.

3GPP2 C.S0014-C Version 1.0, Enhanced Variable Rate Codec, Speech Service 3 Options 3, 68, and 70 for Wideband Spread 4 Spectrum Digital Systems, 3gpp2.org, Jan. 2007, 333 pages.

4GV—Fourth Generation Vocoder, downloaded Jun. 4, 2010 from http://attach.baisi.net/getattach.php?a=4GV_white_+paper.pdf&b=forumid_612%2F4GV_white_paper_5sDJjgw3d76U.pdf&c=application%2Fpdf&rct=j&ei=u2IJTMjTGoS0IQf7oeHcDw&usg=AFQjCNHqf6ciUMJ5wKlYNempi4MOVV5Juw, date unknown, 13 pages.

* cited by examiner

METHOD FOR DATA COMMUNICATION VIA A VOICE CHANNEL OF A WIRELESS COMMUNICATION NETWORK USING CONTINUOUS SIGNAL MODULATION

TECHNICAL FIELD

The present invention relates generally to data communication over a telecommunications network and, more particularly, to data communication over a telecommunications voice channel using an EVRC vocoder.

BACKGROUND OF THE INVENTION

Wired telephone systems were originally designed to carry speech to enable voice conversations over long distances. More recently, public switched telephone systems have become a primary medium for transmitting not only voice, but also non-speech data, such as by use of facsimile machines that transmit image information over the telephone lines, or by modems that exchange digital data of various forms (text, binary executable files, image or video files) over these same phone lines.

Today, cellular and other wireless communication systems are in much greater use for purposes of both voice and data communication. Most cellular communication in use in the world today utilize either the GSM (including UMTS) or CDMA (IS-95 or CDMA2000) communication systems. These systems transmit voice data over a voice traffic channel using a modulated carrier wave. For example, 2G GSM uses GMSK modulation and IS-95 CDMA uses PSK modulation. Prior to modulating the voice data for wireless transmission, the voice input is run through a speech compression circuit such as a vocoder to compress the voice input into a smaller amount of data. This reduces the amount of voice data that needs to be transmitted via the wireless network, thereby permitting the use of a smaller bit rate and a greater number of users sharing the same communication system.

Various vocoder techniques have been proposed and used. The most common are various forms of linear predictive codings (LPC); for example, 2G GSM uses a RPE-LPC speech codec, while IS-95 CDMA uses a variable rate CELP codec. These predictive compression techniques are designed specifically for voice encoding and, as such, are designed to filter out noise and other non-speech components. As a result, the transmission of digital data (such as ASCII text, byte codes, binary files) can be problematic since the vocoder processing can corrupt the digital data, making it unrecoverable at the receiving end of the transmission. For example, the recently introduced Qualcomm™ 4G Vocoder is a CDMA2000 device that exhibits a time-varying, non-linear transfer function which, while acceptable for voice encoding, can impose significant distortion when attempting to transmit digital data via the vocoder.

The 4G vocoder uses the 3gpp2 standards-based EVRC-B codec having a full rate of 9.6 kbps. Alternatively, newer vocoders may use the 3gpp2 EVRC-WB or EVRC-C codec. These codecs also support lower bit rates, including a 4.8 kbps half rate and a 1.2 kbps eighth rate. These lower rates are used when the vocoder determines that the full rate is not needed to adequately transmit the sound signals it receives. For example, background noise is typically transmitted at the one-eighth rate. The EVRC-B vocoder uses these different rates to achieve a target rate that can be controlled by the wireless carrier. For the transmission of data via the voice channel, this can be problematic because the vocoder might choose less than full rate, making it difficult to successfully send non-speech data through the vocoder. For modulation techniques such as frequency shift keying (FSK) and amplitude shift keying (ASK) that have been successfully used with prior generation vocoders (e.g., EVRC-A), the same frequencies and modulation bit rate combinations that have previously worked may not reliably provide two-way transmission of data using the newer (e.g., EVRC-B) vocoders.

SUMMARY OF THE INVENTION

The present invention provides a method of data communication using a wireless communication network that allows the transmission of digital data over a voice channel of the communications network. In accordance with one embodiment, the method includes the steps of:

encoding data sent in either direction between the vehicle and central facility using continuous signal modulation of a carrier signal such that the modulated carrier signal contains no more than four significant frequency components; and transferring the modulated carrier signal between the vehicle and central facility using a newer generation EVRC vocoder.

Preferably, the continuous signal modulation is carried out using either frequency shift keying or amplitude shift keying, wherein the modulation bit rate and frequency(ies) are selected such that the modulated carrier signal can be decoded at the other end with a bit error rate that is less than a selected threshold. Acceptable thresholds may depend upon the particular application, but may vary from 1% or less up to as much as 10%.

In accordance with another aspect of the invention, there is provided a method of exchanging data over a wireless communication system which uses a vocoder in each direction to encode an inputted audio stream using a vocoder that encodes speech segments by determining an approximation of the speech segment, selecting between a full bit rate and one or more slower bit rates based at least in part on an error calculation relating to the difference between the approximation and the speech segment, and generating an encoded speech segment using the approximation and selected bit rate. The method comprises the steps of:

encoding data sent in each direction using continuous signal modulation of a carrier signal at a selected modulation bit rate and one or more frequencies such that the vocoder selects the full bit rate based on the error calculation;

sending the modulated carrier signal over the wireless communication system;

receiving the modulated carrier signal; and demodulating the modulated carrier signal back into the data.

If the vocoder used in this method is a newer generation EVRC vocoder, then the error calculation carried out by the vocoder will utilize a Levinson Durbin recursion, in which case the encoding step preferably further comprises encoding the data using continuous signal modulation of a carrier signal at a modulation bit rate and one or more frequencies such that the vocoder selects the full bit rate as a result of the Levinson Durbin recursion.

In accordance with yet another aspect of the invention, there is provided a method of exchanging data over a wireless communication system which uses a vocoder in each direction to encode an inputted audio stream using a CELP codec that determines a predictor using a Levinson Durbin recursion that generates predictor coefficients, wherein encoding of the speech occurs at a bit rate selected at least in part based on a prediction error that is calculated for each of a number of iterations of the Levinson Durbin recursion. The method comprises the steps of:

encoding first data into a first audio stream that is inputted into the vocoder used for transmission in a first direction over the wireless communication system, wherein the encoding of the first data is carried out using continuous signal modulation of a first carrier signal at a first frequency and selected modulation bit rate such that the prediction error for the first modulated carrier signal falls below a predetermined threshold within a preselected number of iterations of the Levinson Durbin recursion;

sending the first modulated carrier signal over the wireless communication system;

receiving the first modulated carrier signal;

demodulating the first modulated carrier signal back into the first data;

encoding second data into a second audio stream that is inputted into the vocoder used for transmission in a second direction over the wireless communication system, wherein the encoding of the second data is carried out using continuous signal modulation of a second carrier signal at a second frequency and selected modulation bit rate such that the prediction error for the second modulated carrier signal falls below the predetermined threshold within the preselected number of iterations of the Levinson Durbin recursion;

sending the second modulated carrier signal over the wireless communication system;

receiving the second modulated carrier signal; and demodulating the second modulated carrier signal back into the second data.

BRIEF DESCRIPTION OF THE DRAWINGS

Preferred exemplary embodiments of the invention will hereinafter be described in conjunction with the appended drawings, wherein like designations denote like elements, and wherein.

DETAILED DESCRIPTION OF THE PREFERRED EMBODIMENTS

Figure 1:
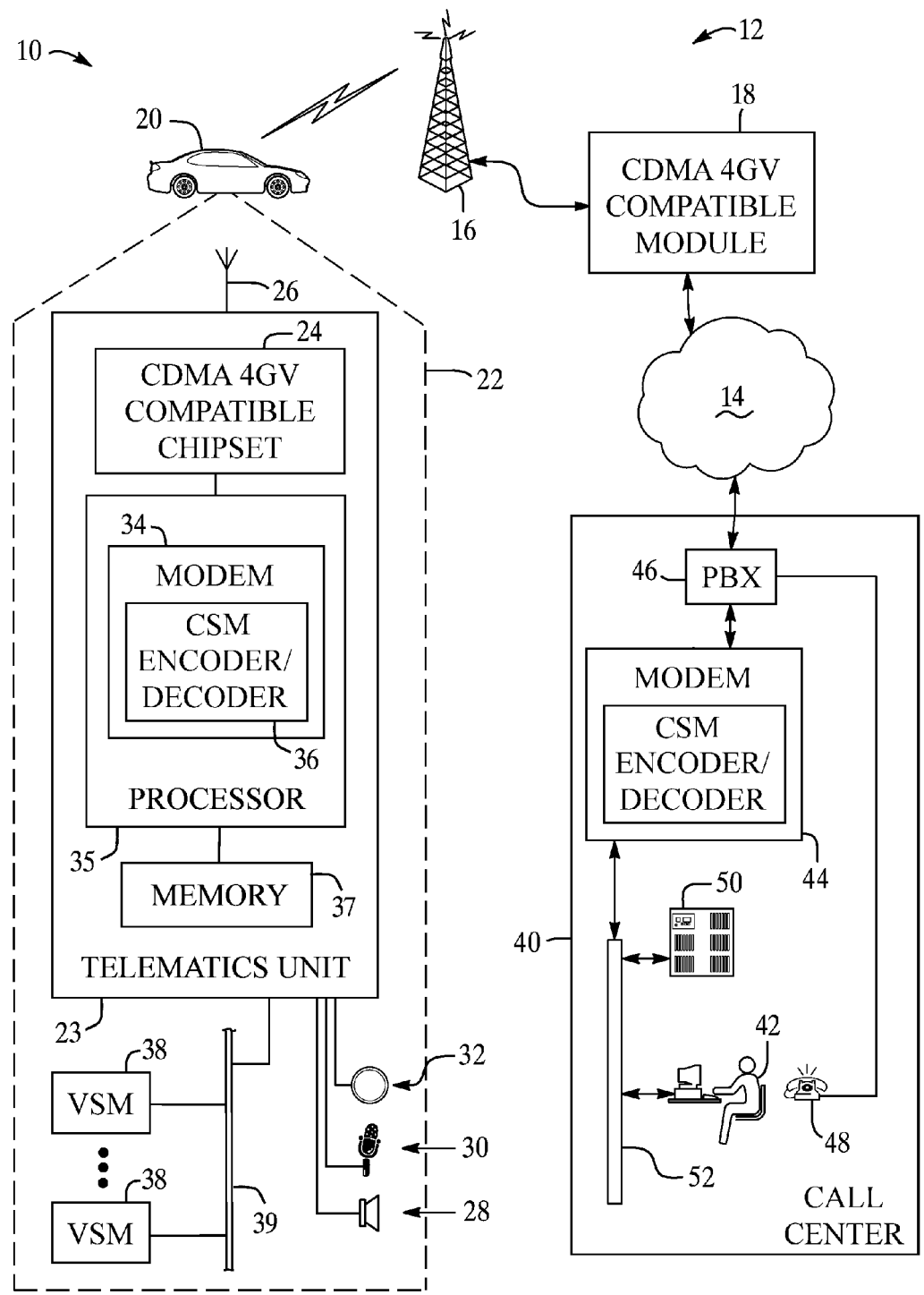
FIG. 1 is a block diagram depicting an electronic communication system constructed in accordance with the invention.

Referring to FIG. 1, there is shown an electronic communication system 10 constructed in accordance with the invention. The communication system 10 includes a conventional cellular communication network having a voice traffic channel that is used for two-way transmission of voice data between cellular telephones. The communication system 10 also includes the ability to utilize the cellular system voice channel to exchange digital data containing information other than speech or other audio. As will be discussed in greater detail below, this data communication is carried out at least in part using continuous signal modulation (CSM) of a carrier signal at one or more audio frequencies selected such that when sent using a newer generation EVRC vocoder, the modulated carrier signal is transmitted by the vocoder at its full rate and can be demodulated at the receiving end such that the bit error rate is within desired, or at least acceptable, limits. This approach enables data communication through a newer generation EVRC vocoder in each direction and over a voice channel using FSK or ASK modulation without any significant loss of information. As used herein, "continuous signal modulation" means modulation of a carrier signal in a manner that produces a resulting modulated carrier signal having no discontinuities. Also, as used herein, "newer generation EVRC vocoder" refers to an EVRC vocoder that is either an EVRC-B vocoder or newer including, for example, an EVRC-WB or EVRC-C vocoder.

The communication system 10 includes in general a cellular communication network 12 connected to a land telephony network 14 which together are used to provide voice and data communication between a passenger vehicle 20 and a call center 40. Vehicle 20 has an onboard electronics system, a portion of which is shown at 22. Electronics system 22 has a telematics unit 23 that includes the components normally found in a cellular communication device, such as a CDMA compatible chipset 24 and antenna 26 that enables use of the cellular network 12 to permit a vehicle occupant to carry on voice conversations using a speaker 28 and microphone 30. These components of telematics unit 23 can be implemented in a conventional manner, as will be known to those skilled in the art. Apart from the microphone 30 input, onboard system 22 also includes at least one pushbutton 32 that can be used to initiate a voice communication with a live advisor 42 located at the call center 40.

In accordance with 4G CDMA systems, voice data from both the vehicle occupant (not shown) and the live advisor 42 are encoded using a vocoder to compress the speech prior to wireless transmission over the voice traffic channel via the cell tower 16. Once received over the wireless network, the encoded speech is then decoded by the vocoder for the listener. The vocoder is incorporated into the chipset 24 as well as in a CDMA compatible module 18 located in the base equipment at the cell tower 16. Although various compression codecs can be used, in the illustrated embodiment, the 4G vocoder is implemented as a time-varying, non-linear filter. Various such codecs are well known using linear predictive techniques; for example, a RPE-LPC codec or a fixed or variable rate CELP codec. In the illustrated embodiment, an EVRC-B codec according to the 3GPP2 C.S0014-B ver. 1.0 standard (available at www.3gpp2.org) is used, although other suitable codecs (whether linear predictive or not) can be used in the system 10 of FIG. 1; for example, any newer generation EVRC vocoder codec, including EVRC-WB and EVRC-C.

In addition to the typical voice data transmission over the voice traffic channel, the communication system 10 enables data communication via this same voice traffic channel and through the vocoder 18, 24. This is accomplished using a modem on either side of the vocoder; that is, using a first modem 34 incorporated into the onboard vehicle communication system 22 and a second modem 44 located at the call center 40. These modems can have the same construction and operation so that only modem 34 will be described, and it will be appreciated that the description of modem 34 applies equally to modem 44. As shown in FIG. 1, the telematics unit 23 can switch or multiplex the CDMA 4GV chipset 24 between the modem 34 and the telephony devices 28-32 so that the cellular communication network 12 can be used for either voice or data communication, or both, even during the same call.

Regardless of whether the cellular call is initiated at the vehicle 20 or call center 40, the transmitting modem can use a predefined system connect tone (e.g., 850, 1778, or 2225

Hz) or series of tones to alert the receiving modem of the requested data transmission, and the various attributes of the data connection can then be negotiated by the two modems. Typically, a different tone will be used in either direction. To enable data communication over the voice channel, the modem applies continuous signal modulation (CSM) to a carrier signal to encode the digital data being transmitted into a CSM carrier signal that can be successfully sent via the vocoder 18, 24 and over the voice traffic channel of the cellular network 12. In the different illustrated embodiments, one or more particular forms of CSM encoding are used; for example, frequency shift keying or amplitude shift keying. As will be discussed farther below, encoding of the digital data is implemented by modem 34 using one or more carrier signals that are modulated with the data using a CSM encoder/decoder 36.

As illustrated in FIG. 1, modem 34 and its encoder/decoder 36 can be implemented using software running on the telematics microprocessor 35. This software can be stored in the telematics memory 37. Other alternative implementations will be apparent to those skilled in the art; for example, the modem 34 could be incorporated into the 4GV chipset 24, or can be implemented using a dedicated IC or other hardware component, or the modem software could be stored on processor 35 itself or on other memory not shown.

On the vehicle 20, the digital data being CSM encoded and sent via modem 34 can be obtained by the telematics unit 23 from one or more vehicle system modules (VSMs) 38 over a vehicle network 39. These modules 38 can be any vehicle system for which information transmission is desired to or from the call center 40 or other remote device or computer system. For example, one VSM 38 can be a diagnostic system that provides diagnostic trouble codes or other diagnostic information to the call center 40. As another example, VSM 38 can be a GPS-enabled navigation system that uploads coordinates or other such information concerning the vehicle's location to the call center. Data can be transmitted from the call center (or other remote device or computer system) to the vehicle as well. For example, where VSM 38 is a navigation system, new maps or other directional or point of interest information can be downloaded to the vehicle. As another example, a VSM 38 can be an infotainment system in which new music or videos can be downloaded and stored for later playback. Furthermore, the term "digital data" as used herein includes not only information, but also executable code such that new programming can be downloaded to the vehicle via the voice traffic channel from a server or other computer. Those skilled in the art will know of other such VSMs 38 and other types of digital data for which communication to and/or from the vehicle 20 is desired.

The vehicle network 39 can be implemented as any suitable network, such as a controller area network (CAN), a media oriented system transfer (MOST), a local interconnection network (LIN), an Ethernet, a local area network (LAN), and can utilize appropriate connections and protocols such as those that conform with known ISO, SAE and IEEE standards and specifications. A separate infotainment network (not shown) can also be included for access by the telematics unit 23 to a vehicle radio system, in which case the speaker 28 could be eliminated and instead the vehicle radio system speaker(s) used for audio output during voice conversations through the communications system 12.

Land network 14 can be a conventional land-based telecommunications network that is connected to one or more landline telephones and connects wireless carrier network 12 to call center 40. For example, land network 14 can include a public switched telephone network (PSTN) and/or an Internet Protocol (IP) network, as is appreciated by those skilled in the art. Of course, one or more segments of land network 14 could be implemented through the use of a standard wired network, a fiber or other optical network, a cable network, power lines, other wireless networks such as wireless local area networks (WLANs) or networks providing broadband wireless access (BWA), or any combination thereof. Furthermore, call center 40 need not be connected via land network 14, but could include wireless telephony equipment so that it can communicate directly with wireless network 12.

Call center 40 includes not only the live advisor 42 and modem 44, but also several other components. It includes a PBX switch 46 to route incoming calls either to one or more telephones 48 for voice communication or to modem 44 for data transmission. The modem 44 itself can be connected to various devices such as a server 50 that provides information services and data storage, as well as a computer used by the live advisor 42. These devices can either be connected to the modem 44 via a network 52 or alternatively, can be connected to a specific computer on which the modem 44 is located. The various components of FIG. 1 include some that are conventional and others that can be implemented based upon the description contained herein and the knowledge possessed by one skilled in the art. For example, although the modems 34, 44 and their CSM encoder/decoder are not conventional components, techniques for implementing CSM encoding and decoding are known and can be implemented by those skilled in the art using such components as DSPs and ASICs. Similarly, the other features needed to implement the modems 34, 44 are all well known to those skilled in the art.

For the EVRC-B and other newer generation EVRC vocoders, the successful transmission of the digital data through the vocoder can be largely dependent on the encoding and transmission rate used by the vocoder. For 4G vocoders such as Qualcomm's® which use an EVRC-B codec that follows the 3GPP2 C.S0014-B ver. 1.0 specification (available at www.3gpp2.org), different rates are used for different types of speech, tones, and background noise. In general, the vocoder encodes and transmits incoming data at a rate that is determined by classifying the inputted signal into categories representative of different types or portions of speech. These categories include voiced, unvoiced, and transient, as well as silence and up- and down-transients. Depending initially upon this classification, but also upon additional tests, the vocoder selects a particular operating mode in which it uses a particular coding scheme and rate to encode and transmit the received data. Generally, this process is carried out on a frame by frame basis, with each frame corresponding to 20 ms of data sampled at 8 kHz. For voice communications, the process is designed to provide a faithful reproduction of speech while accommodating other communication needs (such as ring-back tones) and attempting to minimize bandwidth utilization. However, this process can significantly inhibit data communications over the voice channel because it can result in less than full rate transmission. Without full rate transmission, it can be difficult if not impossible to transmit the digital data through the EVRC-B vocoder at a bit error rate that is acceptable for most applications.

Figure 2:
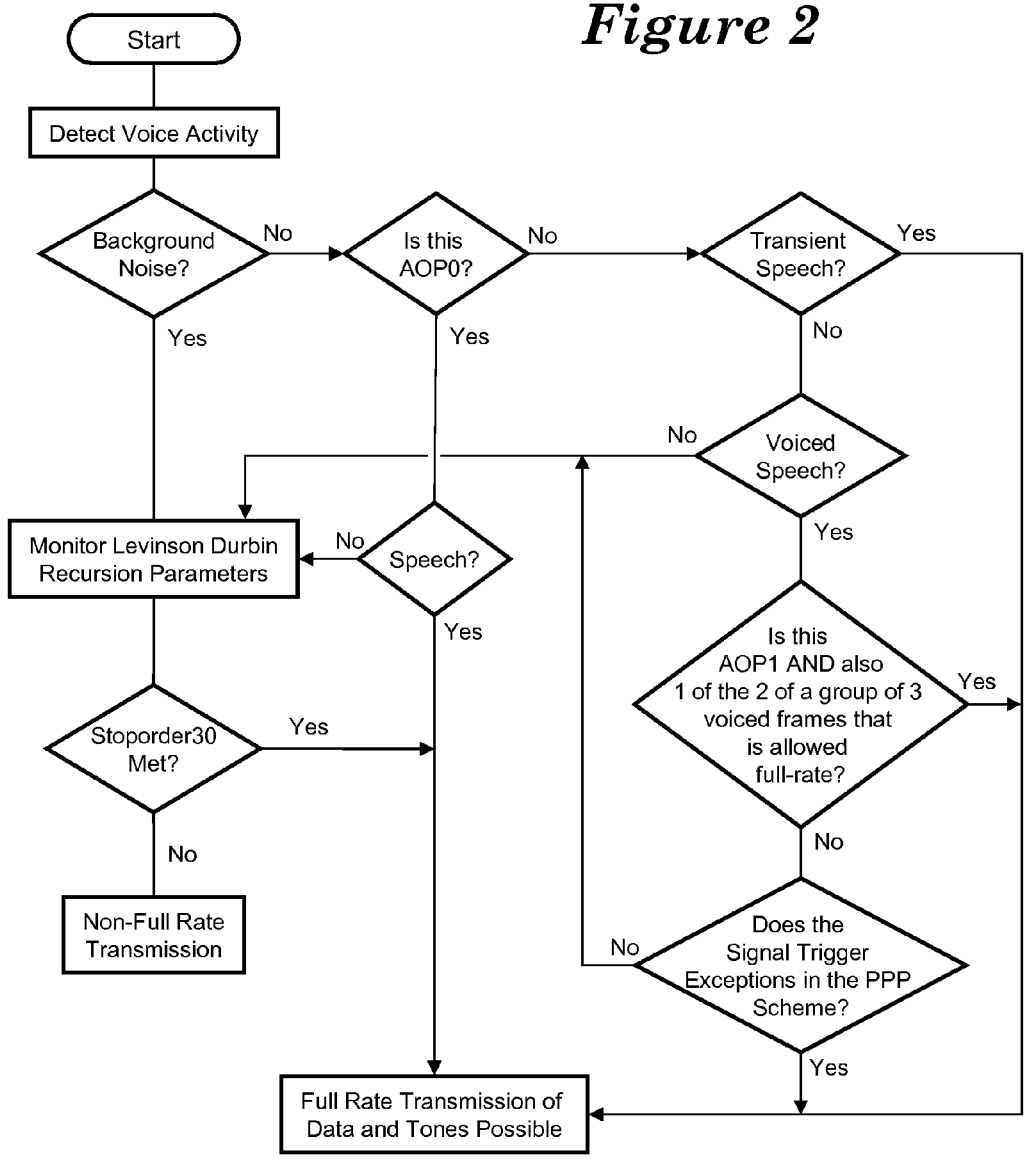
FIG. 2 depicts an overview of the speech classification and rate determination scheme used by EVRC-B vocoders.

For prior generation vocoders that utilize EVRC-A, an incoming signal need only look like speech to get full rate. Thus, modulation techniques such as continuous FSK could be utilized to obtain full rate. For the newer generation EVRC vocoders, however, the ability to achieve full rate is more difficult. FIG. 2 depicts an analysis of the EVRC-B speech classification scheme contained in the 3GPP2 C.S0014-B ver. 1.0 specification, showing the different tests used to classify the incoming data and which of those tests lead to full rate transmission. EVRC-B uses three main anchor operating points (AOP's): AOP0, AOP1, and AOP2. These operating points are used in determining the rate selection and the anchor operating points themselves are determined based on a target average rate that can be adjusted by the wireless carrier. Thus, a service provider desiring to send digital data through the vocoder typically cannot control the anchor operating point determination. Instead, obtaining the desired full rate can be accomplished by modulating or otherwise conditioning the encoded carrier signal according to one or more of the paths of FIG. 2 that lead to the full rate determination.

In general, the process of FIG. 2 classifies the incoming data as one of a number of categories of speech, such as transient or voiced, and based on that categorization determines if it is to be transmitted at full rate. As a part of the EVRC-B vocoder processing, a Levinson Durbin recursion is applied and, regardless of the classification of the speech as transient or otherwise, an error parameter of this recursion is monitored to determine if full rate should be assigned. In particular, a Stoporder30 iteration index is calculated and if this value is less than or equal to four, then full rate transmission is used. This allows for ring back tones to be transmitted at full rate.

The Levinson Durbin recursion is used to model or approximate the frame of speech inputted into the vocoder by determining the poles of an all-pole IIR filter. This is done by multiple recursions of an autocorrelation function to determine the coefficients of the filter. After each iteration, a prediction error (normalized energy error) is calculated that is related to the difference between the approximation (as defined by the computed coefficients) and the inputted speech. For speech segments that can be closely approximated using a low-order polynomial, the error will become quite low within a few iterations of the recursion. Thus, for ring back tones comprising only one or two audio frequencies, the prediction error will fall below a predetermined threshold (e.g., −30 dB) within a preselected number of iterations (e.g., 4) of the Levinson Durbin recursion. Then, by assigning full rate in this instance, the vocoder can help insure that the ring back tones are successfully transmitted. The Stoporder30 test is used to determine whether the inputted speech has this tonal quality to it. In particular, the Stoporder30 test determines whether the prediction error falls below a predetermined threshold of −30 dB within four iterations of the Levinson Durbin recursion. If so, full rate CELP is used to encode the frame of inputted speech.

This feature of newer generation EVRC vocoders can be utilized to enable transmission of digital data using a modulation technique that meets the requirements of the Stoporder30 test. One way in which to do this is to encode the digital data using continuous signal modulation (CSM) of a carrier signal such that the modulated carrier signal contains no more than four significant frequency components. This allows the Levinson Durbin recursion to converge at a small prediction error within the four iterations used by the Stoporder30 test. Furthermore, with a suitable selection of the modulation bit rate and frequency components, the CSM modulated carrier signal can be transmitted between the vehicle and call center or other central facility in a manner that allows the digital data to be decoded from the transferred modulated carrier signal.

Because the EVRC vocoder is designed to encode the phonetic components of speech, it does not handle all frequencies the same. Thus, when producing a modulated carrier signal having no more than four significant frequency components, suitable modulation bit rate and frequency(ies) should be selected such that the bit error rate (BER) of transmitted digital data is within a predetermined acceptable limit. The maximum acceptable BER may depend on the particular application involved, since it may be less important in some data transmission applications than others that a certain BER maximum be met. In general, the BER is preferably no more than 10%, even more preferable is 5% or less, and most commercial applications would utilize a selection of frequency(ies) and modulation bit rate that provides a BER of 3% or less and, most preferably, that is 1% or less.

Apart from using a modulation approach for newer generation EVRC vocoders that produces a carrier signal having no more than four significant frequency components, modulation of a carrier signal using the digital data can be carried out for any vocoder of the type that encodes speech segments (e.g., 20 msec frames) of an inputted audio stream by determining an approximation of the speech segment, selecting between a full bit rate and one or more slower bit rates based at least in part on an error calculation relating to the difference between the approximation and the speech segment, and generating an encoded speech segment using the approximation and selected bit rate. For such vocoders, transmission of the data through the vocoder can be accomplished by the steps of:

encoding data sent in each direction using continuous signal modulation of a carrier signal at a selected modulation bit rate and one or more frequencies such that the vocoder selects the full bit rate based on the error calculation;

sending the modulated carrier signal over the wireless communication system;

receiving the modulated carrier signal; and demodulating the modulated carrier signal back into the data.

The modulation bit rate and one or more frequencies can be pre-selected based at least in part on a bit error rate determination. This can be done by determining one or more combinations of bit rate and carrier frequencies such that the encoded data is sent via the vocoder and then demodulated back into the data at a bit error rate that is below a selected threshold. The threshold can be application dependent and, as described above, can be 10% or less, preferably is 5%, more preferably 3% or less and, in a highly preferred embodiment, is no more than 1%. For newer generation EVRC vocoders and others that use a Levinson Durbin recursion to determine if the error calculation indicates convergence of the approximation within a few iterations, this method can be carried out by encoding the data using continuous signal modulation of a carrier signal at a modulation bit rate and one or more frequencies such that the vocoder selects the full bit rate as a result of the Levinson Durbin recursion.

As a more specific example, transmission of first data in a first direction between the vehicle and central facility and transmission of second data in the reverse direction can be carried out using a vocoder in each direction to encode an inputted audio stream using a CELP codec that determines a predictor using a Levinson Durbin recursion that generates predictor coefficients, wherein encoding of the speech occurs at a bit rate selected at least in part based on a prediction error that is calculated for each of a number of iterations of the Levinson Durbin recursion. The newer generation EVRC vocoders operate in this fashion. The following method can be used to exchange the first and second data:

encoding first data into a first audio stream that is inputted into the vocoder used for transmission in a first direction over the wireless communication system, wherein the encoding of the first data is carried out using continuous signal modulation of a first carrier signal at a first frequency and selected modulation bit rate such that the prediction error for the first modulated carrier signal falls below a predetermined threshold within a pre-selected number of iterations of the Levinson Durbin recursion;

sending the first modulated carrier signal over the wireless communication system;

receiving the first modulated carrier signal;

demodulating the first modulated carrier signal back into the first data;

encoding second data into a second audio stream that is inputted into the vocoder used for transmission in a second direction over the wireless communication system, wherein the encoding of the second data is carried out using continuous signal modulation of a second carrier signal at a second frequency and selected modulation bit rate such that the prediction error for the second modulated carrier signal falls below the predetermined threshold within the pre-selected number of iterations of the Levinson Durbin recursion;

sending the second modulated carrier signal over the wireless communication system;

receiving the second modulated carrier signal; and demodulating the second modulated carrier signal back into the second data.

Again, the predetermined threshold can be −30 dB or other suitable value and the pre-selected number of iterations can be 4 or more or less than this number for vocoders that do not follow the 3gpp2 specification.

Turning now to FIGS. 3-6, various continuous signal modulation (CSM) encoding techniques that can be used with the data transmission methods discussed above will now be described. Because the vocoder used for cellular communication filters out frequencies above that needed for speech transmission, successful data transmission over the cellular voice traffic channel is carried out using audio frequencies at or below several kilohertz. Thus, for the data modulation techniques used in the preferred embodiments, the carrier frequency is limited to those within this upper frequency. Preferably, a frequency range of 300-2,200 Hz is used. Encoding of the data into the carrier signal can be done at the transmitting end by the modem (e.g., by the CSM encoder/decoder 36 in FIG. 1), following which the modulated carrier signal is then sent to the vocoder (e.g., to CDMA chipset 24) for transmission to the central facility. At the receiving end, the modulated carrier signal obtained from the receiving vocoder (e.g., in the CDMA module 18) can be decoded by the receiving modem (e.g., modem 44) back into the original digital data. Techniques for both encoding and decoding data using the various modulation techniques discussed below are known to those skilled in the art.

Figure 3:
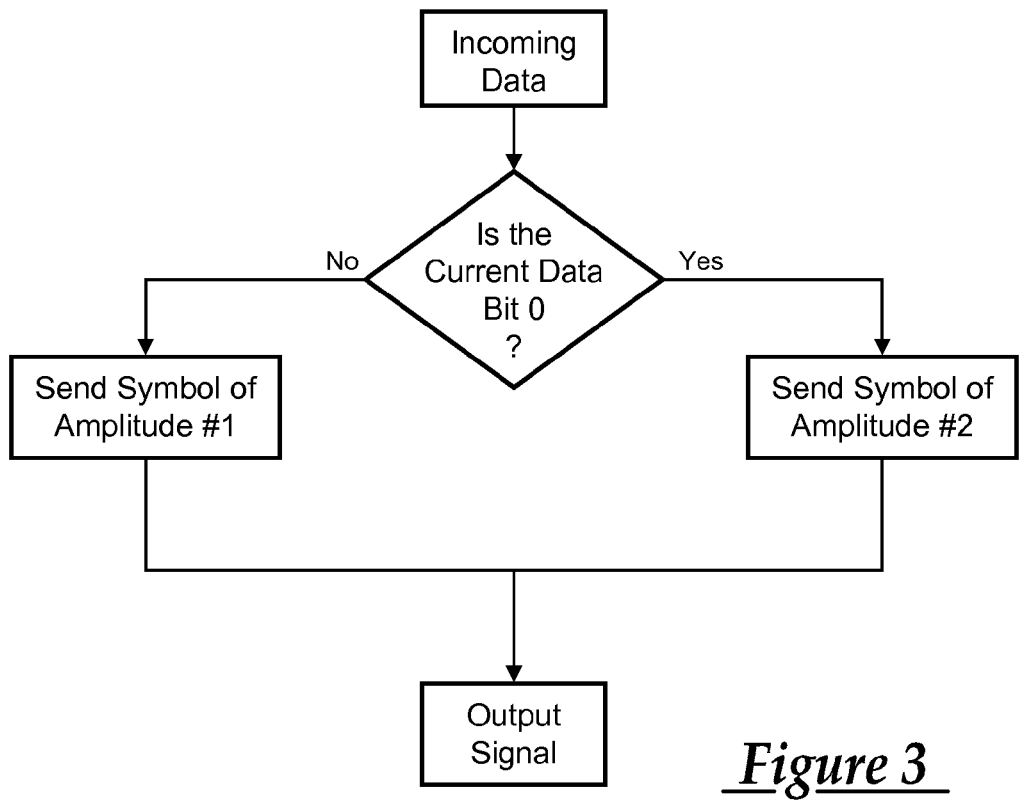
FIG. 3 is a flow chart of an ASK modulation technique.
Figure 4:
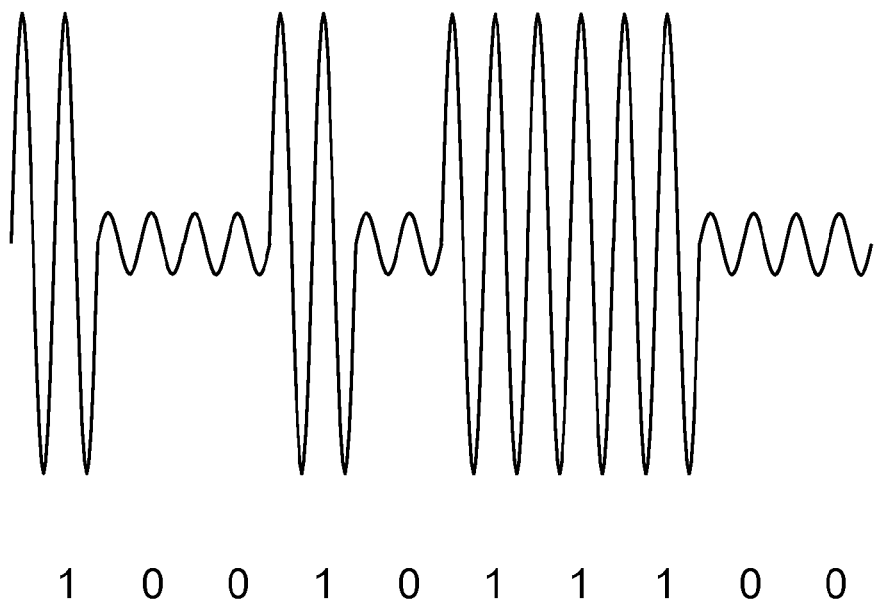
FIG. 4 depicts an exemplary carrier signal modulated by continuous ASK using a random bit pattern.

In FIG. 3, there is shown a method for amplitude shift keying (ASK) modulation of a carrier signal using the binary data to be transmitted. FIG. 4 depicts an exemplary waveform for a sample bit pattern 1001011100. Because the vocoder is designed to efficiently encode speech, not all frequencies within the preferred range of 300-2,200 Hz will produce the same bit error rate for a given modulation bit rate. Thus, selection of the bit rate and frequency can be done empirically by testing various combinations of bit rate and frequency to see what bit error rate is achieved for each combination. Exemplary combinations include 250 bps along with one of the following frequencies: 500 Hz, 700 Hz, 1,000 Hz, and 1,500 Hz. Typically, a different frequency will be used in each transmission direction between the vehicle and central facility.

As discussed above, where a newer generation EVRC vocoder or the like is used that will provide full rate for near-pure tonal data such as ring back tones, the ASK modulation should not involve zero or near-zero amplitudes in the modulation since this will produce discontinuities in the carrier signal. Thus, continuous signal modulation (CSM) using ASK involves modulating the amplitude between two non-zero values and in a manner that provides a continuous carrier signal, as shown in FIG. 4. In this way, discontinuities in the modulated carrier signal can be avoided so that the newer generation EVRC vocoder Stoporder30 test will show the desired convergence within 4 iterations, thereby assuring full rate.

Figure 5:
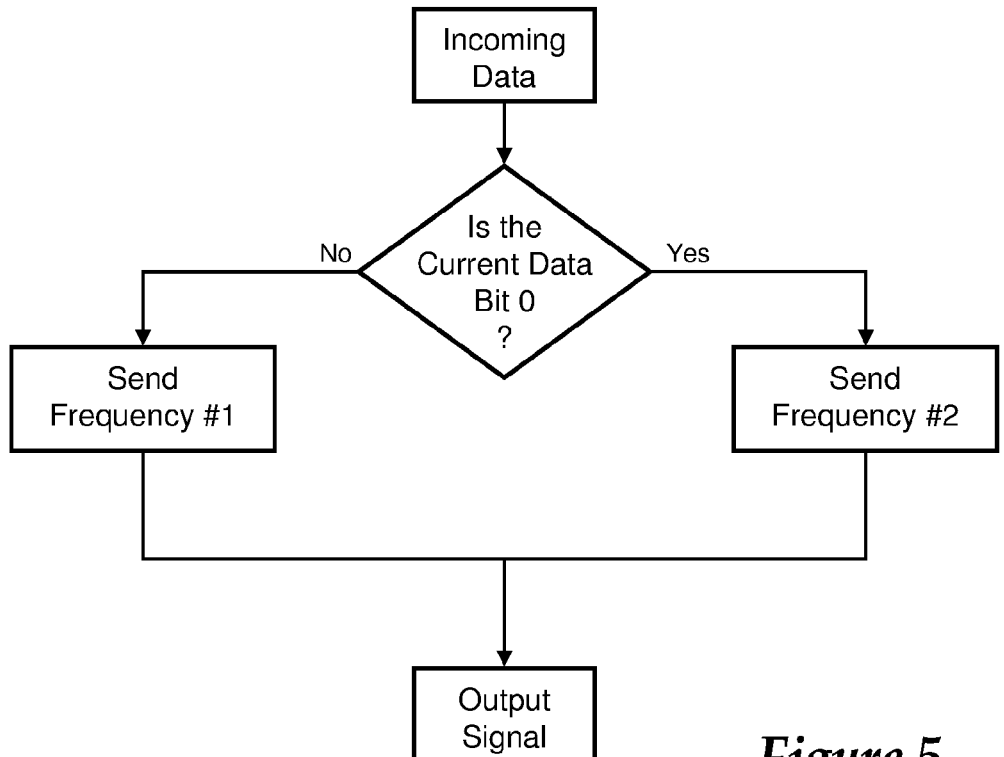
FIG. 5 is a flow chart of an FSK modulation technique.
Figure 6:
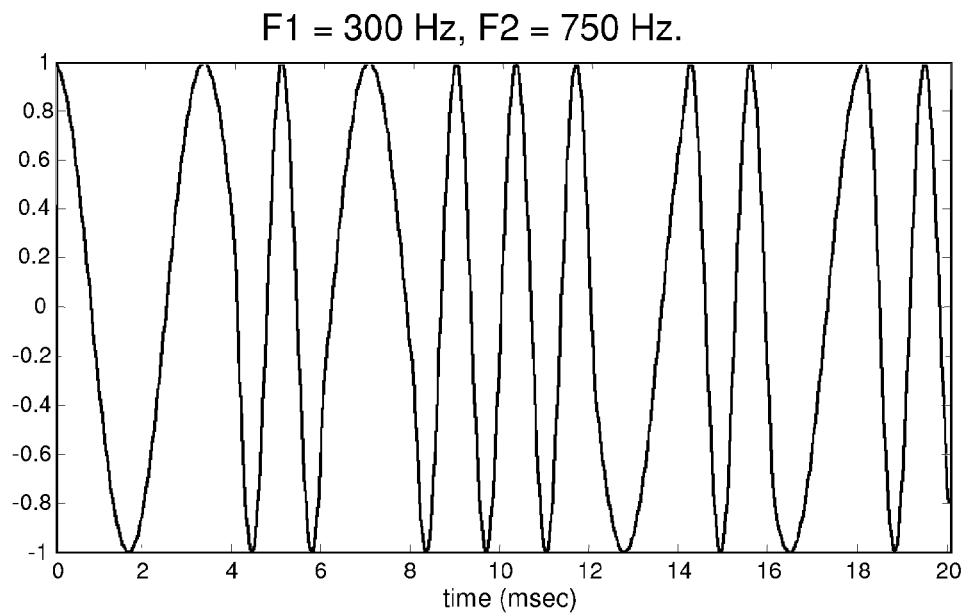
FIG. 6 depicts an exemplary carrier signal modulated by continuous FSK using a random bit pattern at 10 bits/frame.

FIG. 5 depicts a method of frequency shift keying (FSK) modulation. As is known, in FSK, the carrier signal is modulated between two frequencies—in this case frequency no. 1 corresponds to a binary 1 and frequency 2 to a binary 0. An exemplary plot is shown in FIG. 6 for a sample bit pattern 1101001010 at a bit rate of 500 bps, with frequency 1 being 300 Hz and frequency 2 being 750 Hz. For transmission in the reverse direction a different pair of frequencies are preferably used. For a sampling rate of 160 samples at an 8 kHz sampling frequency, these ten sample bits represent a typical 20 ms frame of data, such as is used in CDMA. As with ASK, the FSK modulation is done in a manner that produces a continuous signal with no discontinuities that would prevent the Stoporder30 test from assigning full rate when sent through a newer generation EVRC vocoder.

The determination of desired or acceptable frequency pairs for each direction of data transmission can be done by testing using actual vocoders to encode and then decode the modulated carrier signal, with a checksum or other error detection and/or correction being used to determine the bit error rate. A frequency sweep in increments of, for example, 50 Hz can be used for each particular modulation bit rate testing. Thus, for example, for a bit rate of 500 bps, the first frequency can be set at, e.g., 300 Hz and a range of frequencies for the second frequency tested in the range of 400-2,200 Hz, each time incrementing by 50 Hz and determining the bit error rate. Thereafter, the first frequency can be incremented to 350 Hz and the process repeated. This empirical testing results in a set of frequency pairs and resulting BER can be determined for any particular modulation bit rate. From this, a desired or acceptable combination of modulation bit rate and frequency pairs can be selected for each direction of data transmission. Preferably, the encoding (modulation) bit rate used is in the range of 200-800 bps for continuous FSK. Also, the frequency pairs selected preferably maintain a minimum frequency separation from each other of at least 150 Hz and more preferably 250 Hz. In this regard, where the vehicle to central facility communication protocol uses terminating system connect tones, the selected frequency pairs preferably maintain at least 100 Hz and more preferably at least 200 Hz of frequency separation between the connect tone and frequency pair in any one direction. As one specific example, the modulated carrier signal sent from the vehicle to the call center uses a bit rate of 500 bps and a frequency pair of 650 Hz and 1,150 Hz with a terminating system connect tone between the modems of 850 Hz, whereas in the other direction (call center to vehicle) the data is encoded also at 500 bps, but using a frequency pair of 900 Hz and 1,500 Hz with a system connect tone of 2,225 Hz.

It is to be understood that the foregoing description is of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above.

Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example" and "such as," and the verbs "comprising," "having," "including," and their other verb forms, when used in conjunction with a listing of one or more components or other items, are each to be construed as open-ended, meaning that that the listing is not to be considered as excluding other, additional components or items. Other terms are to be construed using their broadest reasonable meaning unless they are used in a context that requires a different interpretation.

The invention claimed is:

1. A method of sending data between a vehicle and central facility over a wireless communication system, comprising the steps of:
   encoding data sent in either direction between the vehicle and central facility using continuous signal modulation of a carrier signal such that the modulated carrier signal contains no more than four significant frequency components;
   transferring the modulated carrier signal between the vehicle and central facility using a newer generation Enhanced Variable Rate Codec (EVRC) vocoder; and
   decoding the data from the transferred modulated carrier signal;
   wherein the encoding step further comprises encoding the data at a selected bit rate and at one or more selected frequencies such that the decoded data has a bit error rate that is no more than a selected maximum.

2. The method set forth in claim 1, wherein the selected maximum is 10%.

3. The method set forth in claim 1, wherein the selected maximum is 3%.

4. The method set forth in claim 1, wherein the selected maximum is 1%.

5. The method set forth claim 1, wherein the encoding step further comprises:
   generating the modulated carrier signal sent from the vehicle to the central facility using frequency shift keying modulation at a first bit rate that produces a first continuous carrier signal modulated in accordance with the data between first and second frequencies that are selected in conjunction with the bit rate such that the decoded data has a bit error rate of no more than 5%; and
   generating the modulated carrier signal sent from the central facility to the vehicle using frequency shift keying modulation at a second bit rate that produces a second continuous carrier signal modulated in accordance with the data between third and fourth frequencies that are selected in conjunction with the bit rate such that the decoded data has a bit error rate of no more than 5%.

6. The method set forth in claim 5, wherein the first and second bit rates are no more than 800 bps, and wherein the first, second, third, and fourth frequencies are different than one another and are each within the range of 300 Hz to 2,200 Hz.

7. The method set forth in claim 6, wherein the bit rates and frequencies are selected such that the bit error rate of decoded data sent between the vehicle and central facility in either direction is no more than 1%.

8. The method set forth in claim 6, wherein the first frequency is 650 Hz±50 Hz, the second frequency is 1150 Hz±50 Hz, the third frequency is 900 Hz±50 Hz, and the fourth frequency is 1500 Hz±50 Hz.

9. The method set forth in claim 1, wherein the encoding step further comprises:
   generating the modulated carrier signal sent from the vehicle to the central facility using amplitude shift keying modulation that produces a first continuous carrier signal at a first frequency modulated in accordance with the data between first and second non-zero amplitudes; and
   generating the modulated carrier signal sent from the central facility to the vehicle using amplitude shift keying modulation that produces a second continuous carrier signal at a second frequency modulated in accordance with the data between first and second non-zero amplitudes.

10. The method set forth in claim 9, wherein each of the generating steps further comprise encoding the data in the modulated carrier signal at a bit rate that is selected in conjunction with the frequency such that the decoded data has a bit error rate of no more than 5%.

11. The method set forth in claim 9, wherein the first and second frequencies are different than one another and are each within the range of 300 Hz to 2,200 Hz.

12. A method of exchanging data over a wireless communication system which uses a vocoder in each direction to encode an inputted audio stream using a vocoder that encodes speech segments by determining an approximation of the speech segment, selecting between a full bit rate and one or more slower bit rates based at least in part on an error calculation relating to the difference between the approximation and the speech segment, and generating an encoded speech segment using the approximation and selected bit rate, wherein the method comprises the steps of:
   encoding data sent in each direction using continuous signal modulation of a carrier signal at a selected modulation bit rate and one or more frequencies such that the vocoder selects the full bit rate based on the error calculation;
   sending the modulated carrier signal over the wireless communication system;
   receiving the modulated carrier signal; and
   demodulating the modulated carrier signal back into the data.

13. The method set forth in claim 12, further comprising the step of pre-selecting the modulation bit rate and one or more frequencies based at least in part on a bit error rate determination.

14. The method set forth in claim 13, wherein the step of pre-selecting the modulation bit rate and one or more frequencies further comprises pre-selecting the modulation bit rate and one or more frequencies such that data that is encoded using the pre-selected modulation bit rate and one or more frequencies, sent via the vocoder, and then demodulated back into the data has a bit error rate that is below a selected threshold.

15. The method set forth in claim 14, wherein the selected threshold is 5%.

16. The method set forth in claim 14, wherein the selected threshold is 3%.

17. The method set forth in claim 14, wherein the selected threshold is 1%.

18. The method set forth in claim 12, wherein the error calculation carried out by the vocoder utilizes a Levinson Durbin recursion, and wherein the encoding step further comprises encoding the data using continuous signal modulation of a carrier signal at a modulation bit rate and one or more frequencies such that the vocoder selects the full bit rate as a result of the Levinson Durbin recursion.

19. The method set forth in claim 12, wherein the encoding step further comprises:
  generating the modulated carrier signal sent from the vehicle to the central facility using frequency shift keying modulation at a first bit rate that produces a first continuous carrier signal modulated in accordance with the data between first and second frequencies; and
  generating the modulated carrier signal sent from the central facility to the vehicle using frequency shift keying modulation at a second bit rate that produces a second continuous carrier signal modulated in accordance with the data between third and fourth frequencies;
  wherein each of the four frequencies are separated from each other by at least 150 Hz.

20. The method set forth in claim 19, wherein the four frequencies are separated from each other by at least 250 Hz.

21. The method set forth in claim 19, further comprising the step sending a first system connect tone from the vehicle to the central facility and sending a second system connect tone from the central facility to the vehicle, wherein the first system connect tone utilizes a fifth frequency that is separated from the first and second frequencies by at least 200 Hz, and wherein the second system connect tone utilizes a sixth frequency that is separated from the third and fourth frequencies by at least 200 Hz.

22. The method set forth in claim 12, wherein the encoding step further comprises:
  generating the modulated carrier signal sent from the vehicle to the central facility using amplitude shift keying modulation that produces a first continuous carrier signal at a first frequency modulated in accordance with the data between first and second non-zero amplitudes; and
  generating the modulated carrier signal sent from the central facility to the vehicle using amplitude shift keying modulation that produces a second continuous carrier signal at a second frequency modulated in accordance with the data between first and second non-zero amplitudes.

23. A method of exchanging data over a wireless communication system which uses a vocoder in each direction to encode an inputted audio stream using a CELP codec that determines a predictor using a Levinson Durbin recursion that generates predictor coefficients, wherein encoding of the speech occurs at a bit rate selected at least in part based on a prediction error that is calculated for each of a number of iterations of the Levinson Durbin recursion, the method comprising the steps of:
  encoding first data into a first audio stream that is inputted into the vocoder used for transmission in a first direction over the wireless communication system, wherein the encoding of the first data is carried out using continuous signal modulation of a first carrier signal at one or more first frequencies and a selected modulation bit rate such that the prediction error for the first modulated carrier signal falls below a predetermined threshold within a preselected number of iterations of the Levinson Durbin recursion;
  sending the first modulated carrier signal over the wireless communication system;
  receiving the first modulated carrier signal;
  demodulating the first modulated carrier signal back into the first data;
  encoding second data into a second audio stream that is inputted into the vocoder used for transmission in a second direction over the wireless communication system, wherein the encoding of the second data is carried out using continuous signal modulation of a second carrier signal at one or more second frequencies and a selected modulation bit rate such that the prediction error for the second modulated carrier signal falls below the predetermined threshold within the preselected number of iterations of the Levinson Durbin recursion;
  sending the second modulated carrier signal over the wireless communication system;
  receiving the second modulated carrier signal; and
  demodulating the second modulated carrier signal back into the second data.

\* \* \* \* \*